United States Patent
Gunapala et al.

(10) Patent No.: US 7,129,104 B2
(45) Date of Patent: Oct. 31, 2006

(54) WAVELENGTH-INSENSITIVE RADIATION COUPLING FOR MULTI-QUANTUM WELL SENSOR BASED ON INTERSUBBAND ABSORPTION

(75) Inventors: Sarath D. Gunapala, Valencia, CA (US); Sumith V. Bandara, Valencia, CA (US); John K. Liu, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 286 days.

(21) Appl. No.: 10/409,866

(22) Filed: Apr. 8, 2003

(65) Prior Publication Data

US 2003/0199113 A1    Oct. 23, 2003

Related U.S. Application Data

(62) Division of application No. 09/443,925, filed on Nov. 19, 1999, now Pat. No. 6,545,289.

(60) Provisional application No. 60/109,330, filed on Nov. 20, 1998.

(51) Int. Cl.
 *H01L 21/00*    (2006.01)

(52) U.S. Cl. .............................. 438/29; 438/9; 438/39; 438/57; 438/66

(58) Field of Classification Search ................ 438/7–9, 438/29, 31–40, 57, 63, 66, 73, 700–701, 438/707–713, 726–728, 737–739
See application file for complete search history.

(56) References Cited

U.S. PATENT DOCUMENTS

| | | | |
|---|---|---|---|
| 5,272,356 | A | 12/1993 | Wen et al. |
| 5,384,469 | A | 1/1995 | Choi |
| 5,470,761 | A | 11/1995 | McKee et al. |
| 5,485,015 | A | 1/1996 | Choi |

OTHER PUBLICATIONS

Song et al , "Magnetically confined plasma reactive ion etching of GaAs/AlGaAs/AlAs quantum nanostructures", J. Vac. Sci. Technol. B, vol. 12, No. 6, 1994, pp. 3388-3392.*

* cited by examiner

*Primary Examiner*—Thanhha Pham
(74) *Attorney, Agent, or Firm*—Fish & Richardson P.C.

(57) ABSTRACT

Devices and techniques for coupling radiation to intraband quantum-well semiconductor sensors that are insensitive to the wavelength of the coupled radiation. At least one reflective surface is implemented in the quantum-well region to direct incident radiation towards the quantum-well layers.

3 Claims, 2 Drawing Sheets

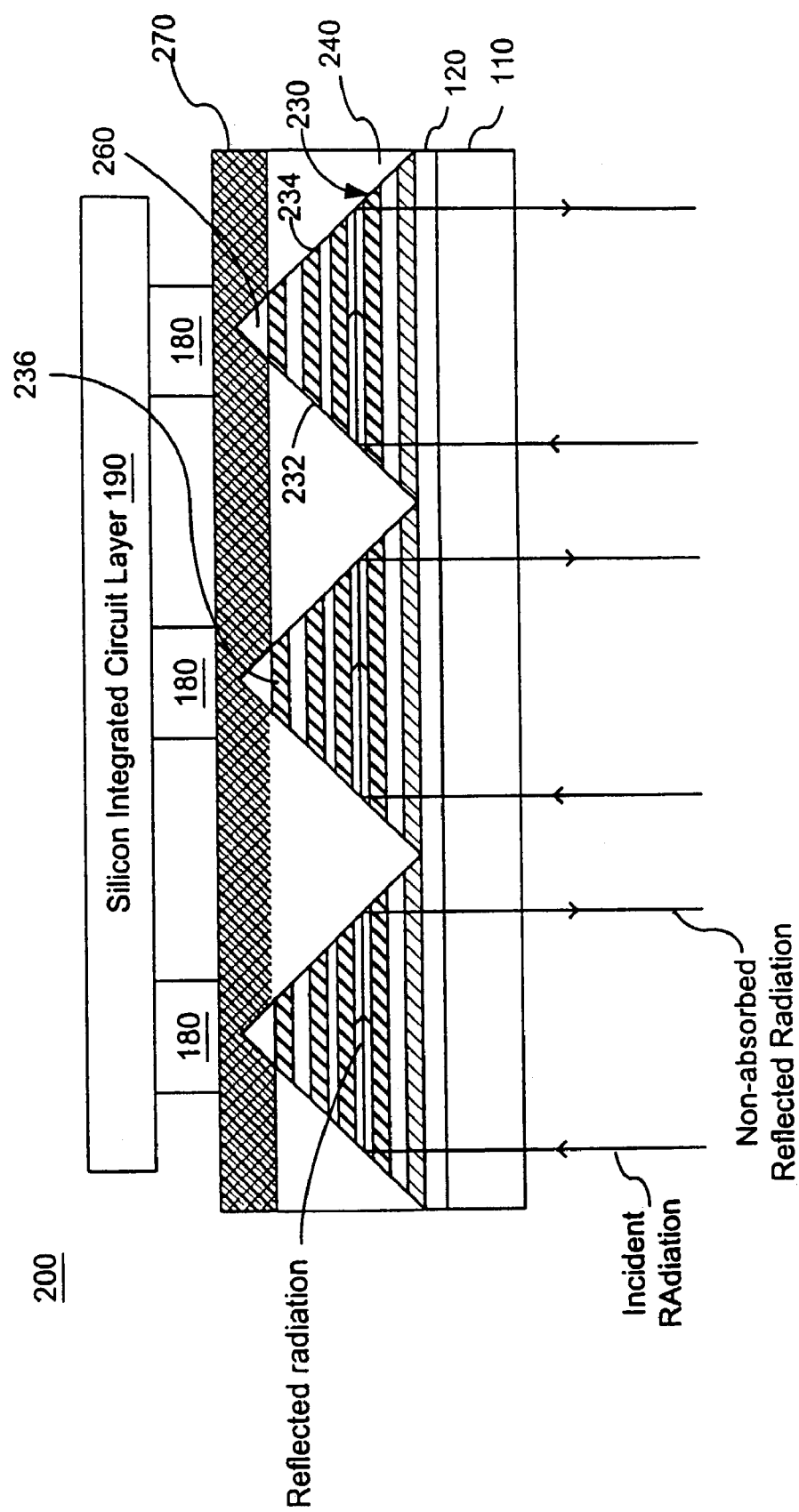

WAVELENGTH-INSENSITIVE RADIATION COUPLING FOR MULTI-QUANTUM WELL SENSOR BASED ON INTERSUBBAND ABSORPTION

CROSS-REFERENCE TO RELATED APPLICATIONS

This application is a divisional application of and claims priority to U.S. application Ser. No. 09/443,925, filed Nov. 19, 1999, now U.S. Pat. No. 6,545,289, which claims the benefit of U.S. provisional application Ser. No. 60/109,330, filed Nov. 20, 1998.

ORIGIN

The devices and techniques described herein were made in the performance of work under a NASA contract, and are subject to the provisions of Public Law 96-517 (35 U.S.C. §202) in which the Contractor has elected to retain title.

BACKGROUND

This specification relates to devices and techniques of coupling radiation energy to a quantum-well radiation sensor.

An infrared quantum-well semiconductor sensor usually includes a quantum-well structure formed of alternating active and barrier semiconductor layers. Such a quantum-well structure can have different energy bands. Each can have multiple quantum states. An intraband transition between a ground state and an excited state in the same band (i.e., a conduction band or a valance band) can be used to detect infrared ("IR") radiation by absorbing IR radiation at or near a selected resonance IR wavelength. The absorption of the radiation generates electric charge indicative of the amount of received radiation. The radiation-induced charge can then be converted into an electrical signal (e.g., a voltage or current) to be processed by signal processing circuitry.

The compositions of lattice-matched semiconductor materials of the quantum well layers can be adjusted to cover a wide range of wavelengths for infrared detection and sensing. In comparison with other radiation detectors, quantum-well structures can achieve, among other advantages, high uniformity, a low noise-equivalent temperature difference, large format arrays, high radiation hardness, and low cost. Infrared quantum-well sensing arrays may be used for various applications, including night vision, navigation, flight control, environmental monitoring.

A quantum-well infrared sensor usually responds to incident radiation with a polarization that is perpendicular to the quantum well layers, i.e., parallel to the growth direction. This is because this polarization can induce an intraband transition at a desired infrared wavelength. In applications based on imaging at focal plane arrays, the photodetector array is often oriented perpendicular to the scene to be imaged. Since the electric vector is essentially parallel to the quantum well layers in this arrangement, the quantum well layers absorb little or no light.

Hence, a coupling mechanism is often implemented to couple incident radiation in a way that at least a portion of the incident radiation becomes absorbable by the quantum well layers. The coupling efficiency of the coupling mechanism can be characterized by the percentage of absorbable radiation, but not what is actually absorbed, of the total incident radiation. One way to provide proper coupling is to use random reflectors or corrugated surfaces to scatter a portion of the incident radiation into the correct polarization for absorption. Alternatively, one-dimensional or two-dimensional grating couplers can also be used to convert normally-incident radiation to waves have components that propagate along the quantum well layers.

However, the coupling efficiencies of these coupling schemes are sensitive to the wavelength of the radiation. Hence, their applications are limited to detection of radiation at a single selected wavelength or a narrow spectral range and hence cannot be used for detection of radiation of multiple colors. In addition, these coupling schemes direct only a portion of the incident beam to be parallel to the absorbing quantum well layers and hence limit the coupling efficiency to an upper limit that is determined by the percentage of the portion of radiation propagating parallel to the quantum well layers.

SUMMARY

This disclosure includes devices and techniques for coupling radiation to quantum-well semiconductor sensors that are insensitive to the wavelength of the coupled radiation. One embodiment of a quantum-well semiconductor device includes a radiation-sensing region and non-radiation-sensing region that are adjacent to each other over a substrate. The radiation-sensing region has a plurality of alternating quantum-well layers parallel formed over the substrate and operating to absorb radiation by at least one intraband transition. A reflective surface is formed between the non-radiation-sensing region and the radiation-sensing region to have an angle with respect to the substrate to reflect incident radiation from the substrate towards the radiation-sensing region. The angle may be chosen to make the reflected radiation to propagate substantially parallel to the quantum-well layers.

These and other features and associated advantages of the devices and techniques are described in detail in the following.

BRIEF DESCRIPTION OF THE DRAWINGS

FIG. 2 shows another embodiment of a quantum-well sensor that has pyramid-like quantum-well regions to couple radiation to the absorbing quantum layers with a desired polarization.

DETAILED DESCRIPTION

Figure 1:
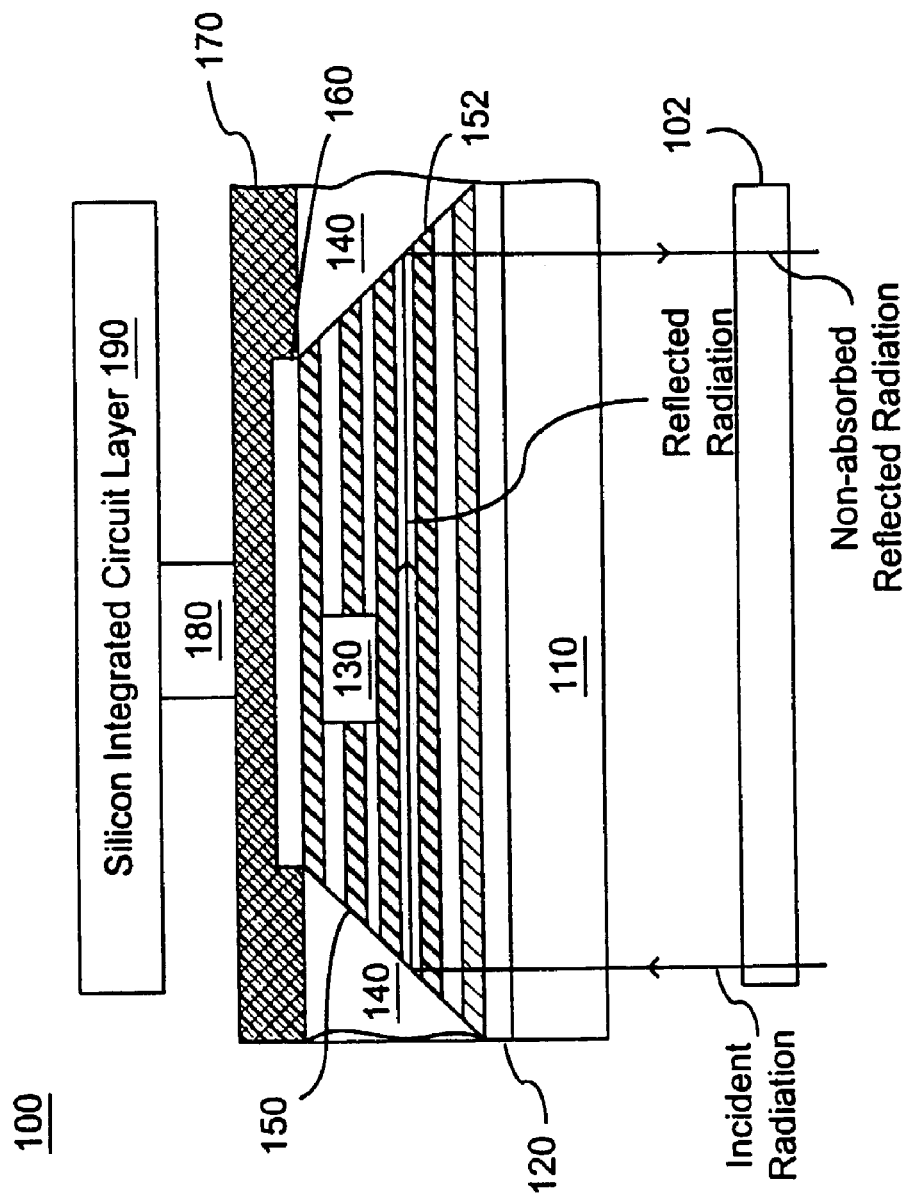
FIG. 1 shows on embodiment of a quantum-well sensor that has at least one reflective surface to direct incident radiation to the quantum-well layers.

Present devices and techniques are designed to direct incident radiation to propagate within the absorbing quantum well layers in a direction that is substantially parallel to the quantum well layers. Polarization of the radiation is generally perpendicular to the direction of propagation. Hence, the polarization can be directed to be perpendicular to the quantum well layers and therefore be absorbed by the quantum well layers to produce charge for detection and signal processing.

In comparison with other coupling techniques which direct a beam at an angle with respect to the quantum well layers, the present devices and techniques direct the entire incident radiation, rather than a portion of it, to be parallel to the quantum well layers. When the input radiation is linearly polarized, the entirety of the input radiation can be so directed to have its polarization perpendicular to the quantum well layers and hence be absorbed. Thus, the coupling efficiency can essentially be up to 100%. When the input radiation is randomly polarized, the coupling efficiency can be up to 50%. Hence, with other device parameters being equal, the coupling efficiencies of the present devices and techniques are significantly higher than many conventional coupling schemes.

At least one reflective surface is implemented to intercept the quantum-well layers at a desired angle so that incident radiation at or around a known incident angle can be reflected to propagate in a direction substantially parallel to the quantum-well layers. For example, when the device is designed to detect incident radiation that is nominally perpendicular to the quantum-well layers, the angle of the reflective surface may be set at or around 45°.

The present devices and techniques are insensitive to the wavelength of the radiation under detection. The reflection of the reflective surface can be configured to be insensitive to the wavelength of the incident radiation. For example, the reflective surface may be coated with a reflective layer having one or more layers of appropriate materials to produce a substantially constant reflectivity for a range of wavelengths to which the quantum-well layers are responsive Also, the reflective surface may be simply a boundary surface between the quantum-well layers and another different material. This difference in the materials on the two sides of the boundary can make the surface reflective to radiation of different wavelengths.

FIG. 1 shows one embodiment of an intraband quantum-well sensing device 100 that implements a reflective surface for radiation coupling. The device 100 includes a substrate 110 on which structures of the sensing device are formed. The substrate 110 is semi-insulating and may be formed of a semiconductor material (e.g., GaAs). In addition, the substrate 110 is substantially transparent to radiation at one or more wavelengths to be detected and functions to receive incident radiation. A conductive contact layer 120 is formed over the substrate 110 to provide an electrical bias to the device 100. The contact layer 120 may be made of a heavily doped semiconductor material such as doped GaAs.

A quantum-well radiation-sensing region 130 and a non-radiation-sensing region 140 are formed adjacent to each other above the contact layer 120. The quantum-well region 130 includes multiple layers of alternating active and barrier layers of two different semiconductor materials and absorb radiation at one or more wavelengths. The quantum-well layers are parallel to the surface of the substrate 120. The quantum-well layers may include two or more different stacks of different quantum well structures that have intraband transitions at different wavelengths to allow the device 100 to simultaneously detect radiation of different colors.

The region 140 is formed of a material different from the quantum-well region 130. An insulator material, e.g., a glass material or polymide, may be used to construct the region 140. The regions 130 and 140 are divided by a slanted surface 150 that forms an angle with respect to the substrate 120. The surface 150 is designed to be reflective to the radiation to be detected. The angle of the surface 150 is set to reflect radiation incident from the side of the substrate 110 at one or a range of incident angles to propagate in the quantum-well region 130 in a direction that is substantially parallel to the quantum-well layers.

The device 100 further includes another conductive contact layer 160 over the quantum-well region 130 which is used to provide a potential different from that on the contact layer 120 to bias the quantum-well region 140. A metallic ohmic layer 170 is formed atop the contact layer 160 to supply the electrical potential to the contact layer 160. The metallic layer 170 covers at least the contact layer 160 and may also cover the surface of the non-radiation-sensing region 140 as shown in FIG. 1. Above the metallic layer 170 is one or more circuit layers 190 that are formed on a silicon substrate to receive and process the radiation-induced output signal generated in the quantum-well region 130. A layer of indium bumps 180 may be formed over the metallic layer to provide an electrical interface between the circuit layer 190 and the quantum-well region 130. Each pixel has one indium bump 180.

When the incident radiation is polarized, either the device 100 or the incident polarization may be rotated to ensure that the polarization of the reflected radiation in the quantum-well region 130 is substantially perpendicular to the quantum-well layers. In the latter, a polarization rotating element 102 may be placed in front of the substrate 110 to control the incident polarization.

An additional reflective surface 152 may be desirable to efficiently use the quantum-well region 130 in the device 100 of FIG. 1. The additional reflective surface 152 is also slanted to form an angle with respect to the substrate 110. Incident radiation impinging the additional reflective surface 152 is reflected to travel along the quantum-well layers in the region 130 towards the reflective surface 150. This configuration of two opposing reflective surfaces increases the active area for receiving and converting the radiation into a state with a detectable polarization.

FIG. 2 shows another embodiment of an intraband quantum-well sensing device 200 that has an array of pyramid-like quantum-well regions 230 based on the above 2 reflective surface configuration. Each quantum-well region 230 has two slanted reflective surfaces 232 and 234 to form a pyramid-like structure. The fabrication of the quantum well structure may use the PMMA (polymethylmethacrylate) pattern transfer technology. Pyramid regions 230 can be fabricated by first forming a PMMA mask layer over GaAs epitaxial materials by using e-beam lithograph and PMMA development. The pattern on the PMMA mask layer is then transferred to epitaxially grown GaAs by using ECR (electron cyclotron resonance) plasma reactive ion etching. Non-radiation-sensing regions 240 fill in the voids between the quantum-well regions 230 with a different material such as an insulator.

On top of each quantum region 230, a small flat surface 236 is formed between the surfaces 232 and 234 to support a conductive contact layer 260 (e.g., heavily-doped semiconductor like GaAs). A metallic contact layer 270 is formed to cover all contact layers 260 and the top surface of the non-radiation-sensing regions 240. The angle of slanted surfaces 232 and 234 may be around 45° to receive radiation incident at a direction substantially perpendicular to the substrate 110.

In operation, the two reflective surfaces 232 and 234 in each region 230 reflect all received radiation to propagate either substantially parallel to the quantum-well layers or at angles with respect to the quantum-well layers. Such reflected radiation becomes absorbable.

A quantum sensing array may be constructed based on the configuration of the device 200. Each pixel may include at one or more sensing regions 230. The slanted reflective surfaces 230 and 232 also confine radiation in pixel from entering other pixels to blur the image. The non-absorbed reflected radiation is reflected towards the substrate 110 rather than being received by other pixels.

Although only a few embodiments are disclosed, other embodiments, variations, and modifications are intended to be encompassed by the following claims.

What is claimed is:

1. A method for fabricating a quantum-well sensing array comprising:

fabricating quantum-well layers over a substrate;

forming a patterned PMMA (polymethylmethacrylate) layer over the quantum-well layers;

performing reactive ion etching to the quantum-well layers through the patterned PMMA layer to form an array of pyramid-shaped voids in the quantum-well layers with boundary planes each at an angle of about 45 degrees with respect to said substrate wherein said boundary planes reflecting incident radiation form the substrate to a direction parallel to the quantum-well layers thereby increasing coupling efficiency of the quantum-well sensing array; and filling the pyramid-shaped voids with a non-radiation-sensing insulator material.

2. The method as in claim 1, further comprising making each side surface of each pyramid-shaped void to be about 45 degrees with respect to the quantum-well layers.

3. The method as in claim 1, further comprising making the quantum-well layers to have two different quantum-well structures stacking together to absorb light of at least two different wavelengths.

* * * * *